United States Patent
Goel et al.

(10) Patent No.: US 8,140,923 B2
(45) Date of Patent: Mar. 20, 2012

(54) TEST CIRCUIT AND METHOD FOR TESTING OF INFANT MORTALITY RELATED DEFECTS

(75) Inventors: Sandeep Kumar Goel, Milpitas, CA (US); Narendra B. Devta-Prasanna, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 252 days.

(21) Appl. No.: 12/421,527

(22) Filed: Apr. 9, 2009

(65) Prior Publication Data

US 2010/0262876 A1 Oct. 14, 2010

(51) Int. Cl.
*G01R 31/28* (2006.01)
*G01R 35/00* (2006.01)
*G01R 31/00* (2006.01)

(52) U.S. Cl. ........ 714/726; 714/724; 714/729; 714/742; 714/745; 702/108; 702/117

(58) Field of Classification Search .................. 714/724, 714/726, 729, 742, 745; 702/108, 117
See application file for complete search history.

(56) References Cited

U.S. PATENT DOCUMENTS

| | | | | |
|---|---|---|---|---|
| 5,748,646 A * | 5/1998 | Hosokawa | ................ | 714/726 |
| 5,867,332 A * | 2/1999 | Mattison | ................ | 360/51 |
| 6,760,873 B1 * | 7/2004 | Hao et al. | ................ | 714/724 |
| 7,061,224 B2 * | 6/2006 | Kakizawa et al. | ......... | 324/76.54 |
| 7,302,658 B2 * | 11/2007 | Takeoka et al. | ............. | 714/744 |
| 7,308,625 B1 * | 12/2007 | Wingen et al. | ............. | 714/724 |
| 7,613,971 B2 * | 11/2009 | Asaka | ............. | 714/731 |
| 7,685,486 B1 * | 3/2010 | Lai | ............. | 714/725 |
| 7,778,790 B2 * | 8/2010 | Furuya | ............. | 702/117 |
| 7,831,877 B2 * | 11/2010 | Sul et al. | ............. | 714/731 |
| 7,917,319 B2 * | 3/2011 | Hafed | ............. | 702/69 |
| 2003/0149924 A1 * | 8/2003 | Bedal et al. | ............. | 714/726 |
| 2009/0198461 A1 * | 8/2009 | Hafed | ............. | 702/69 |
| 2010/0293425 A1 * | 11/2010 | Heron et al. | ............. | 714/731 |

* cited by examiner

*Primary Examiner* — John J Tabone, Jr.

(57) ABSTRACT

The disclosure provides embodiments of ICs and a method of testing an IC. In one embodiment, an IC includes: (1) a functional logic path having a node and at least one sequential logic element and (2) test circuitry coupled to the functional logic path and having a delay block, the test circuitry configured to form a testable path including the delay block and the node in response to a test mode signal, wherein a delay value of the delay block is selected to detect a small delay defect associated with the node.

21 Claims, 3 Drawing Sheets

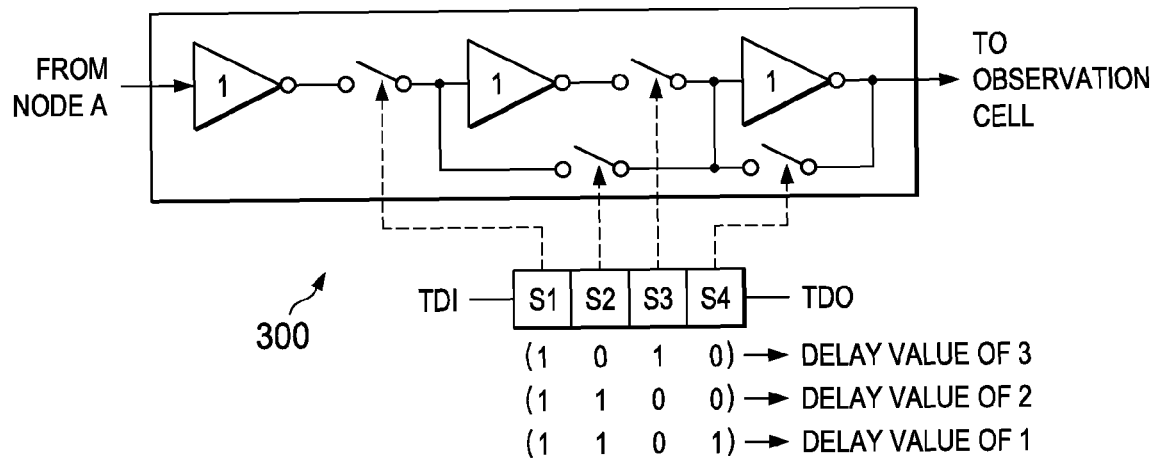
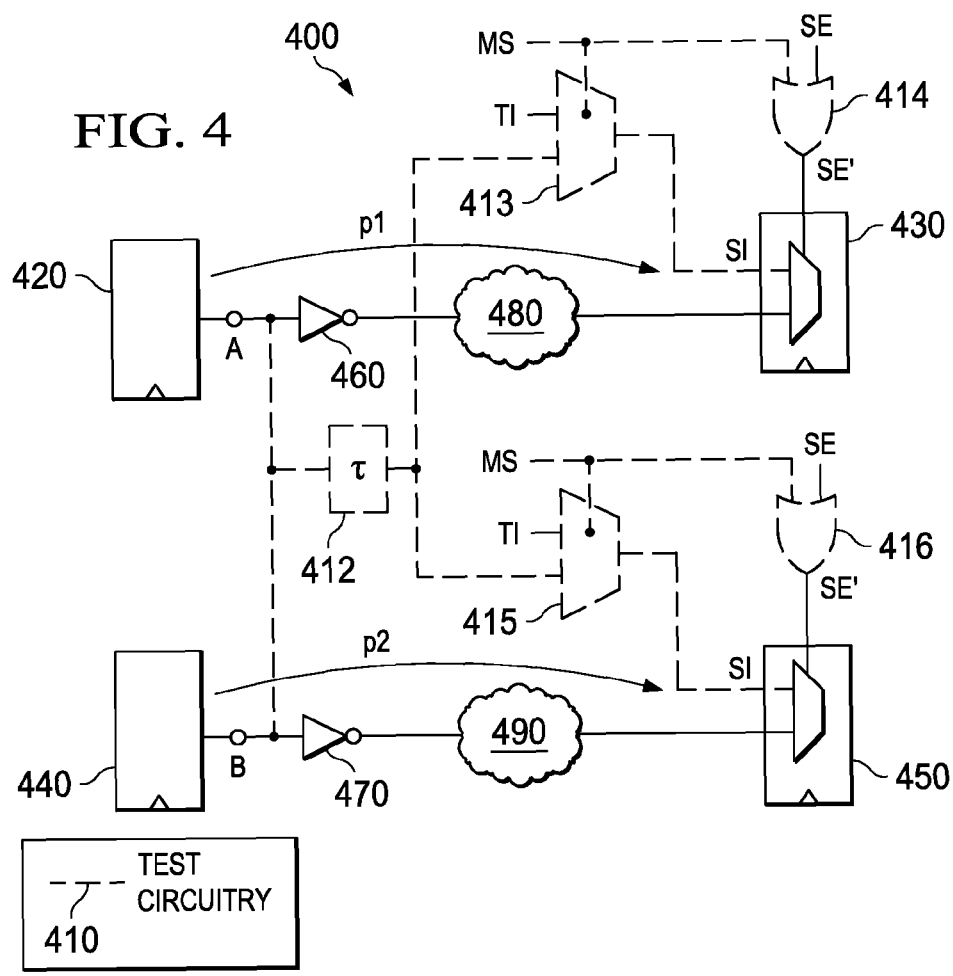

TEST CIRCUIT AND METHOD FOR TESTING OF INFANT MORTALITY RELATED DEFECTS

TECHNICAL FIELD

This application is directed, in general, to testing integrated circuits (IC) for manufacturing defects and, more specifically, to detecting infant mortality related defects.

BACKGROUND

Automatic Test Pattern Generation (ATPG) is used to find a test pattern (an input or test sequence) that, when applied to an IC, allows a tester to determine between correct circuit behavior and faulty circuit behavior caused by defects. The generated test patterns can be used to test ICs after manufacture (i.e., manufacturing testing). Manufacturing testing, however, may not be able to detect all defects associated with manufacturing. For example, infant mortality related defects may be difficult to detect.

Infant mortality relates to ICs that fail at a relatively higher rate over a short period of time due to manufacturing defects. Infant mortality failures are typically defined as those failures that cannot be detected during the manufacturing test of the IC and manifest themselves after a certain period in time when the IC is in an intended application. Inherent manufacturing defects, possibly those caused by contamination or process variability, that can cause IC's to have shorter lifetimes are referred to as infant mortality related defects. Infant mortality related defects may be weak resistive opens or shorts resulting in small additional delays.

Detecting infant mortality defects often depends on the defect size, defect location, clock speed and defective behavior. Presently, burn-in testing or current based testing techniques may be used to detect infant mortality related defects. Burn-in, however, can be expensive and destructive. Additionally, due to, for example, increased complexity and smaller feature sizes, current based tests such as IDDQ may not be as effective. This is especially true for smaller process nodes, such as 90 nm or smaller. At the smaller technology nodes, IDDQ and other current based tests can be rendered ineffective for detecting infant mortality related defects due to the background current leakage being high and a small difference between faulty and fault-free devices.

SUMMARY

The disclosure provides an IC in one aspect. In one embodiment, the IC includes: (1) a functional logic path having a node and at least one sequential logic element and (2) test circuitry coupled to the functional logic path and having a delay block, the test circuitry configured to form a testable path including the delay block and the node in response to a test mode signal, wherein a delay value of the delay block is selected to detect a small delay defect associated with the node.

In another aspect, a method of testing an IC for defects is disclosed. In one embodiment, the method includes: (1) receiving a test mode signal at test circuitry of the IC, wherein the test circuitry is inactive during normal operation of the IC, (2) forming a testable path based on the test mode signal that includes a delay block of the test circuitry and a node of a functional path of the IC connected to the test circuitry, wherein a delay value of the delay block is selected to detect a small delay defect associated with the node, (3) capturing a test signal propagating through the node and the delay block based on the test mode signal and (4) indicating if a small delay defect is associated with the node.

In yet another aspect, another IC is provided. In one embodiment, the IC includes: (1) an input cell and an observation cell of a scan chain, (2) a functional path having a node and coupled between the input cell and the observation cell and (3) test circuitry having a delay block, the test circuitry couplable, based on a test mode signal, between the node and the observation cell to form a testable path including the delay block and the node, wherein a delay value of the delay block is selected to detect a small delay defect associated with the node.

In still yet another aspect, a library of standard logic elements is provided. In one embodiment, the library includes test circuitry having a delay block, a multiplexer and a logic gate, the test circuitry configured to be coupled, based on a test mode signal, between a node of a functional logic path of an integrated circuit and an observation cell thereof to form a testable path including the delay block and the node, wherein a delay value of the delay block is selected to detect a small delay defect associated with the node

BRIEF DESCRIPTION

Reference is now made to the following descriptions taken in conjunction with the accompanying drawings, in which:

FIG. 3 illustrates a schematic diagram of an embodiment of a delay block 300 having a programmable delay value constructed according to the principles of the disclosure;

FIG. 4 illustrates a schematic diagram of another embodiment of an IC constructed according to the principles of the disclosure.

DETAILED DESCRIPTION

The disclosure provides a test circuit and a Design for Test (DFT) method for detection of infant mortality related defects. The test circuit and method can be used by a manufacturer to test ICs before shipment. The test circuitry is inserted into ICs during manufacturing and may be activated in special test modes to test IC paths for extremely small delay defects, such as defects in the range of a few nanoseconds or picoseconds. The added test circuitry forms a testable path having a delay that can be programmable based on, for example, a test speed, a system speed or a defect size that is targeted to detect. The added test circuitry can be fully testable and is designed to have limited or no effect on the functionality of the IC path or IC paths being tested (i.e., the IC path or paths coupled to the test circuitry).

The disclosed test circuitry can be fully programmed through existing boundary scan circuitry, including input cells and observation cells, typically included in ICs. As such, no additional pins are required for programming the test circuitry. Additionally, the proposed circuitry can be used to increase reliability by providing redundancy for critical parts and nodes in a given IC. In some embodiments, the disclosed test circuitry can be shared among different nodes of the IC to minimize area overhead.

Figure 1:
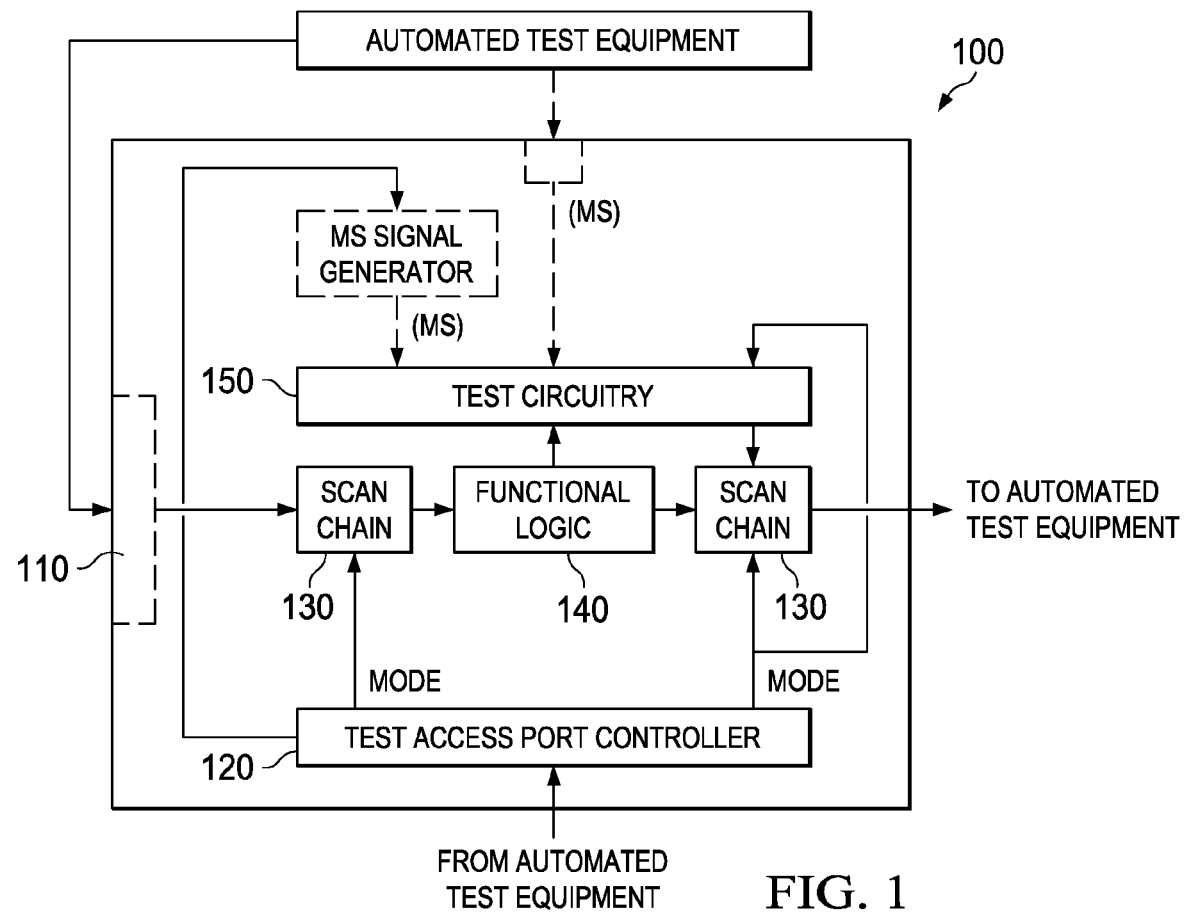
FIG. 1 illustrates a block diagram of an embodiment of an IC constructed according to the principles of the present invention.

FIG. 1 illustrates a block diagram of an embodiment of an IC 100 constructed according to the principles of the present invention. The IC 100 includes a test interface 110, a tap controller 120, a scan chain 130, functional logic 140 and test circuitry 150. The IC 100 may be a JTAG-compliant device having conventional boundary scan circuitry including, for example: a boundary cell on each I/O pins; a scan chain that connects the boundary cells together in a serial manner; a JTAG compliant interface to handle the JTAG signals; a Test Access Port (TAP) for controlling the JTAG signals used in boundary-scan testing and the TAP controller 120 that controls the states of operation of the boundary-scan testing. The states or modes of operation include the typical functional mode and the scan mode, that includes capture and shift mode. Additionally, the tap controller 120 may provide a test mode signal MS provided by, for example, Automated Test Equipment (ATE) to indicate a special capture mode or a modified shift mode. As illustrated, the ATE may be an off-chip ATE. In some embodiments, an on-chip ATE (for example Built-in-Self-Test (BIST)) can be used to generate, for example, a test mode signal. The ATE may also include a display that is used to provide test results that are obtained employing the test circuitry 150. An ATPG tool may be used to generate the test patterns for some of the modes of operation.

The test interface 110 may be a TAP interface that is JTAG compliant and is controlled by the TAP controller 120. The scan chains 130 may be a conventional scan chain that allows testing of circuitry, including the functional logic 140 and the test circuitry 150 in the IC 100. The IC 100 may include additionally circuitry, interfaces, etc., that are typically included in an IC. For example, the IC 100 may include a clock, a voltage interface, etc. Additionally, in some embodiments, the IC may include a MS signal generator or a MS pin. Both of these components will be discussed in more detail below.

The functional logic 140 is the logic circuitry of the IC 100 that is configured to operate during the functional mode of the IC 100. The functional logic 140 is coupled to the scan chains 130 and the test circuitry 150.

The test circuitry 150 is coupled to a functional logic path of the functional logic 140 at a node (i.e., a point used for a connection) of the functional logic path. In some embodiments, the test circuitry 150 may be coupled to multiple functional logic paths of the functional logic 140. The test circuitry 150 includes a delay block having a delay value that is selected to detect a small delay defect associated with the node (e.g., at the node or proximate the node) of the functional logic path. The test circuitry 150 is configured to form a testable path including the delay block and the node in response to a test mode signal MS.

The delay value of the delay block may be selected based on a slack margin associated with the node. The slack margin is defined as the difference in path length and the clock period. In other embodiments, the delay value may be selected based on a test speed, a system speed or a defect size that is targeted to be detected. The delay block may include at least one delay element, such as an inverter, to provide the desired delay value. In some embodiments, multiple inverters may be coupled in series to provide the desired delay value. In other embodiments, the delay block may have a delay value that is programmable. In these embodiments, the delay block may include multiple inverters that are coupled in series by switches. The switches may be controllable through boundary scan pins of the IC 100.

In addition to the delay block, the test circuitry 150 may include a multiplexer and a logic gate. The multiplexer can be configured to form the testable path in response to the test mode signal MS. The logic gate can be configured to allow a signal propagating through the node and the test circuitry to be captured based on the test mode signal MS. The logic gate can also be configured to allow testing of the test circuitry in response to the test mode signal MS and a scan enable signal SE.

The multiplexer of the test circuitry 150 is coupled to the test interface 110 and is configured to receive the test mode signal MS therefrom. As indicated by the dashed lines in FIG. 1, the test mode signal may also be received by the test circuitry 150 from other locations in other embodiments. For example, the test mode signal MS can be generated on the IC 100 and provided to the test circuitry 150. In one embodiment, the test mode signal MS can be generated on the IC 100 by test circuitry including a finite-state machine and/or a counter and comparator. In this case, the MS signal can be generated after the counter has reached a particular value or the finite state machine has a reached a particular state. Another example would be to use a shift register that is programmable via the TAP controller 120. Alternatively, the test mode signal MS can be received from an off-chip source, such as the ATE. The test mode signal MS may be received from the off-chip source via a JTAG compliant interface, such as the interface 110, or via a top-level pin (illustrated in FIG. 1 as a dashed-box) of the IC 100. In some embodiments, the top-level pin may be used for other inputs, also.

Figure 2:
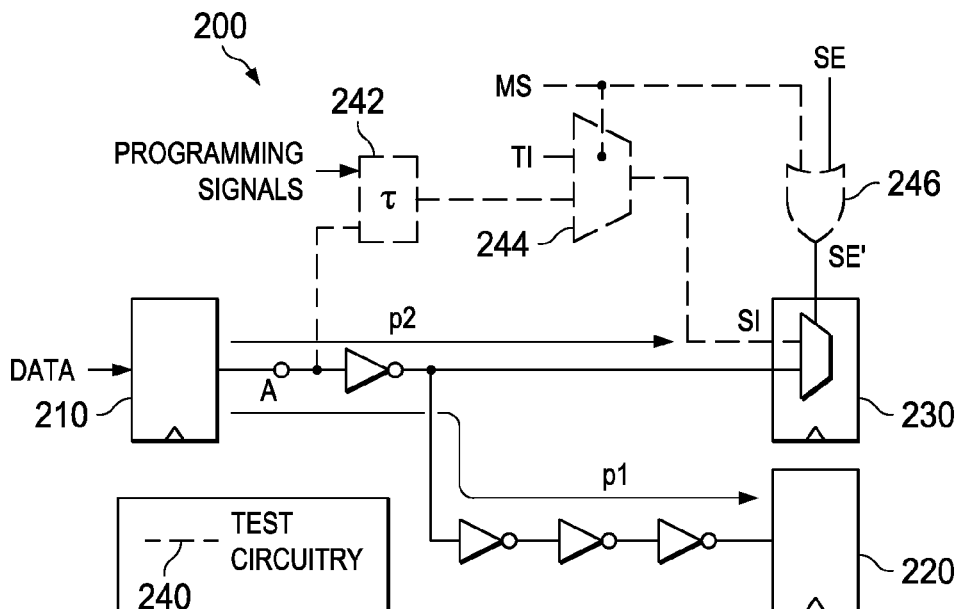
FIG. 2 illustrates a schematic diagram of an embodiment of an IC constructed according to the principles of the present disclosure.

FIG. 2 illustrates a schematic diagram of an embodiment of an IC 200 constructed according to the principles of the present disclosure. The IC includes an input cell 210, a first capture cell 220, a second capture cell 230, a first functional path 1 (p1), a second functional path 2 (p2) and test circuitry 240. The IC 200 may include additional components and additional functional paths or blocks of logic elements which are not illustrated but are typically included in an IC.

The input cell 210, the first capture cell 220 and the second capture cell 230 may be conventional flip-flops. Each of the flip-flops 210, 220, 230, may be part of a scan chain of the IC 200. The input cell 210 may be used to launch signals and the capture cells 220, 230, may be used to capture the input signals. The capture cells 220, 230, may also be considered as observation cells.

The first functional path 1 and the second functional path 2 include logic elements that are designed to perform a designated function during normal operation of the IC 200. In FIG. 2, the logic elements of the first functional path 1 and the second functional path 1 are inverters. In other embodiments, functional paths may include different logic elements besides inverters. The first functional path 1 begins at node A, ends at the first capture cell 220 and includes four inverters. The second functional path 2 begins at node A, ends at the second capture cell 230 and includes a single inverter.

The test circuitry 240 is couplable between the node and the second capture cell 230 or observation cell to form a testable path based on the test mode signal MS. The testable path includes the node and a delay block 242 of the test circuitry 240. The delay block 242 has a delay value that is selected to detect a small delay defect associated with the node. The delay block 242 may have a fixed delay value or may have a programmable delay value.

For example, FIG. 3 illustrates a schematic diagram of an embodiment of a delay block 300 having a programmable delay value constructed according to the principles of the disclosure. The delay block includes multiple inverters couplable in series by switches. The switches may be micro-switches that can be turned on or off to control the delay value of the delay block 300. In one embodiment, the switches may be pass transistors. In other embodiments, the switches may be nmos or pmos transistors.

The switches may have dedicated controls as illustrated or may share controls. For example, switch 2 and switch 3 may be controlled together since only one of these switches will be activated at a time. The switches, and therefore the delay value, can be programmable through boundary scan pins (e.g., TDI and TDO) wherein the registers for controlling the switches behave as a boundary scan data register.

The delay block 300 can be programmed to one, two or three inverter delays. In FIG. 3, this would equate to a one, two or three inverter delay. For example, a TDI input of (1,0,1,0) will provide a delay value of three nanoseconds by providing a control input of either a 1 or 0 bit to turn on or turn off the switches. Other examples of inputs and the corresponding delay values are also illustrated in FIG. 3.

Turning back to FIG. 2, in addition to the delay block 242, the test circuitry 240 includes a multiplexer 244 and a logic gate 246. As illustrated in FIG. 2, the logic gate 246 may be an OR gate. In other embodiments, the test circuitry 240 may be configured to employ a different logic gate or a combination of logic gates instead of an OR logic gate.

The multiplexer 244 is configured to form the testable path in response to receiving the test mode signal MS. The logic gate 246 is configured to allow a signal propagating through the node A and the test circuitry 240, including the delay block 242, to be captured based on the test mode signal MS. The logic gate 246 can also be configured to allow testing of the test circuitry 240 in response to the test mode signal MS and a scan enable signal SE. The IC 200 may be operated in several modes as described below. Some of these modes, such as the shift mode, are common modes used in scan testing.

In a normal operating mode (i.e., a functional mode), the test mode signal MS and the scan enable signal SE are not asserted. The scan enable signal SE', therefore, is also not asserted. For example, MS=0, SE=0, and SE'=0. As such, the multiplexer 244 does not connect the delay block 242 to the second capture cell 230. The testable path, therefore, is not formed and is not active. The IC 200, including the first and second functional paths p1 and p2, should be operating as designed.

In a shift mode, the scan enable signal is asserted and the test mode signal MS is not asserted. The scan enable signal SE', therefore, is asserted. For example, MS=0, SE=1, and SE'=1. In the shift mode, normal shift operation occurs. As such, the scan signal SI input of the second capture cell 230 is the test input signal TI. An ATPG tool may be used to generate the test input signal TI. In one embodiment, the test input signal TI for the shift mode may be a flush test pattern. In some embodiments where the input cell 210 and the second capture cell 230 are neighboring flip-flops in the same scan chain, the test input signal TI can be an output of 210.

In a special capture mode, the test mode signal MS is asserted and the scan enable signal SE is not asserted. Accordingly, the scan enable signal SE' is asserted. Additionally, since the test mode signal MS is asserted, the multiplexer 244 activates the testable path between the node A and the second capture cell 230. In the special capture mode, the data propagating through the input cell 210 and the node A is delayed by the delay value of the delay block 242 and is captured by the second capture cell 230. In one embodiment, the data or test signal may be a transition fault pattern generated by an ATPG tool. In the special capture mode, other functional paths not connected to the test circuitry 240, such as the first functional path 1, operate in the normal mode. In the special capture mode, MS=1, SE=0, and SE'=1.

In a modified shift mode, the test mode signal MS is asserted, the scan enable signal SE is asserted and the scan enable signal SE' is asserted. In the modified shift mode, the test circuitry 240 is made active and the data at node A traverses through the delay block 242 to the second capture cell 230. In the modified shift mode, the test circuitry 240 is placed in the shift mode allowing testing thereof. For example, the data input through the input cell 210 may be a flush test pattern for a flush test of the test circuitry 240. As known in the art, a flush test is a shift test where a selected flush pattern is shifted all the way through scan chains. Flush patterns can be applied to scan chains, and in this disclosure the test circuitry 240, to test them for open or short defects. In the modified shift mode, MS=1, SE=1, and SE'=1. Thus, for testing functional logic of the IC 200, a normal shift mode can be applied (i.e., MS=0, SE=1) followed by applying the special capture mode (i.e., MS=1, SE=0) for detecting small delay defects. The modified shift mode (i.e., MS=1, SE=1) can also be applied to test the test circuitry 240.

FIG. 4 illustrates a schematic diagram of another embodiment of an IC 400 constructed according to the principles of the disclosure. The IC 400 includes test circuitry 410 having a delay block 412 that is shared by different nodes, node A and node B, of the IC 400. In addition to the shared delay block 412, the test circuitry 410 includes a first multiplexer 413, a first logic gate 414, a second multiplexer 415 and a second logic gate 416. Each of these logical elements may operate as the multiplexer and the logic gate of the test circuitry in FIG. 2, respectively.

The IC 400 also includes a first input flip-flop 420, a first capture flip-flop 430, a second input flip-flop 440 and a second capture flip-flop 450. Each of these logical elements may operate as the input flip-flop and the capture flip-flops of FIG. 2, respectively. The IC 400 also includes a first functional path 1 and a second functional path 2. Each of these paths includes a first delay element 460, 470, coupled to other logical elements 480, 490, which are represented by the network clouds in FIG. 4. The IC 400 may also include additional components and additional functional paths or blocks of logic elements which are not illustrated but are typically included in an IC.

Employing the test circuitry 410 having a shared delay block 412 allows minimizing the area overhead of the IC 400. In one embodiment, the shared delay block 412 is a programmable delay block. The shared delay block 412 may be configured as the programmable delay block of FIG. 3.

Figure 5:
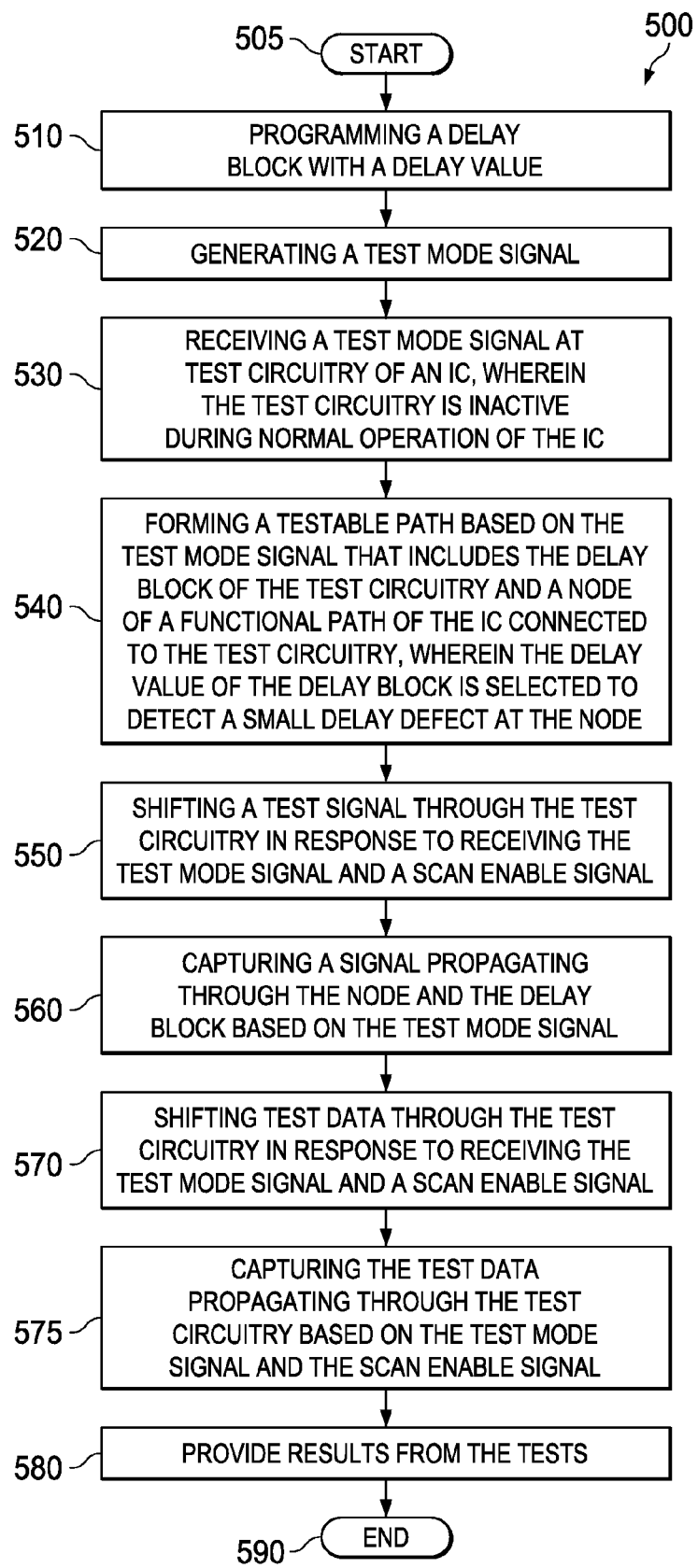
FIG. 5 illustrates a flow diagram of an embodiment of a method of testing an IC for defects carried out according to the principles of the present disclosure.

Turning now to FIG. 5, illustrated is a flow diagram of an embodiment of a method 500 of testing an IC for defects carried out according to the principles of the present disclosure. The IC being tested includes test circuitry that is not active during normal operation of the IC. The testing may be performed by the IC manufacturer before shipment to detect infant mortality related defects. A test apparatus such as an ATE may be used to provide signals to direct the operation of the method 500 of testing. An ATPG tool associated with the ATE may be used to provide patterns to be used in the method 500. The method 500 begins in a step 505.

In a step 510, a delay block is programmed with a delay value. In one embodiment, the delay value may be based on a slack margin of a node of a functional path of the IC. In other embodiments, the delay value may be based on test speed or a desired defect size to detect. The delay value may be programmed employing boundary scan inputs. In some embodiments, the delay value may be changed during testing. Additionally, the delay value may be fixed during manufacturing.

In a step 520, a test mode signal is generated in a step 520. In one embodiment, the test mode signal may be generated on-chip. In other embodiments, the test mode signal may be generated off-chip. An ATE may be used to generate the test mode signal.

After the test mode signal is generated, the test mode signal is received at the test circuitry of the IC in a step 530. The test mode signal may be received by a multiplexer of the test circuitry. As noted above, the test circuitry of the IC is inactive during normal operation thereof. The test circuitry may be used in some embodiments to provide redundant elements if needed.

A testable path is then formed in a step 540 based on the test mode signal. The testable path includes the delay block of the test circuitry and a node of a functional path of the IC connected to the test circuitry. The multiplexer is used to form the testable path when the test mode signal is received. The delay value of the delay block is selected to detect a small delay defect associated with the node. The small delay defect may be an infant mortality related defect.

In a step 550, a test signal is shifted through the test circuitry in response to receiving the test mode signal and a scan enable signal. Based on the test mode signal, a signal propagating through the node and the delay block is captured in a step 560. The propagating signal can be captured by a capture flip-flop of a scan chain of the IC. The signal may be a test pattern such as a transition fault pattern.

Additionally, test data is shifted through the test circuitry in response to receiving the test mode signal and a scan enable signal in a step 570. The test data may be a flush test pattern that allows testing of the test circuitry. The test data propagating through the test circuitry can also be captured in a step 575 based on the test mode signal and the scan enable signal. The capture flip-flop may be used to capture the test data.

In a step 580, the captured signal and test data are provided. The captured signal and test data may be provided via a display of an ATE. To provide the captured signal and test data, electrical signals may be generated by the ATE based on the captured signal and test data. Instead of a visual display, the electrical signals may be used to generate a printed report or transmit test results. A status may also be provided that indicates if delay defects were detected or the condition of the test circuitry. The method 500 then ends in a step 590.

At least parts of the above-described system, apparatus and method may be embodied in or performed by various conventional digital data processors or computers, wherein the computers are programmed or store executable programs of sequences of software instructions on computer readable storage medium to perform one or more of the steps of the methods, e.g., steps of the method of FIG. 5. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 5. ATE or a test apparatus designed for detecting delay defects such as infant mortality related defects may include the necessary circuitry to perform or direct at least some of the steps of the method of FIG. 5.

Those skilled in the art to which this application relates will appreciate that other and further additions, deletions, substitutions and modifications may be made to the described embodiments.

What is claimed is:

1. An integrated circuit, comprising:
   a functional logic path having a node, at least one sequential logic element and an observation cell; and
   test circuitry distinct from and coupled to said functional logic path at said node and couplable to said observation cell based on a test mode signal, said test circuitry having a delay block and configured to form a testable path including said delay block and said node in response to said test mode signal, wherein said delay block has a delay value for detecting a small delay defect associated with said node when a signal propagates through said testable path.

2. The integrated circuit as recited in claim 1 wherein said delay value is programmed based on a slack margin associated with said node.

3. The integrated circuit as recited in claim 1 wherein said delay block includes at least one delay element.

4. The integrated circuit as recited in claim 1 wherein said delay value is programmable.

5. The integrated circuit as recited in claim 4 wherein said delay block includes multiple inverters coupled in series by switches.

6. The integrated circuit as recited in claim 5 wherein said switches are controllable through boundary scan pins of said integrated circuit.

7. The integrated circuit as recited in claim 1 wherein said test circuitry further includes a multiplexer and a logic gate.

8. The integrated circuit as recited in claim 7 wherein said multiplexer is configured to form said testable path in response to said test mode signal.

9. The integrated circuit as recited in claim 7 wherein said logic gate is configured to allow the signal propagating through said node and said test circuitry to be captured based on said test mode signal.

10. The integrated circuit as recited in claim 7 wherein said logic gate is configured to allow testing of said test circuitry in response to said test mode signal and a scan enable signal.

11. The integrated circuit as recited in claim 7 wherein said logic gate is an OR gate.

12. The integrated circuit as recited in claim 1 wherein said functional path is a first functional path of said integrated circuit and said test circuitry is also coupled to at least a second functional path of said integrated circuit, wherein said first functional path and said second functional path share said delay block during testing.

13. The integrated circuit as recited in claim 7 wherein said multiplexer is coupled to and configured to receive said test mode signal from a JTAG port of said integrated circuit, an external pin of said integrated circuit, or an internal generator of said integrated circuit.

14. A method of testing an integrated circuit for defects, comprising:
   receiving a test mode signal at test circuitry of said integrated circuit, wherein said test circuitry is inactive during normal operation of said integrated circuit, said integrated circuit including a functional path connected to said test circuitry;
   forming a testable path based on said test mode signal that includes a delay block of said test circuitry, a node of said functional path and an observation cell of said functional path, wherein said test circuitry is distinct from said functional path;
   capturing a test signal propagating through said testable path based on said test mode signal, wherein said testable path includes said node and said delay block, said delay block having a delay value for detecting a small delay defect associated with said node when said test signal propagates through said testable path; and indicating if said small delay defect associated with said node is detected.

15. The method of testing as recited in claim 14 wherein said test signal is a transition fault pattern.

16. The method of testing as recited in claim 14 further comprising generating said test mode signal on said integrated circuit.

17. The method of testing as recited in claim 14 further comprising shifting test data through said test circuitry in response to receiving said test mode signal and a scan enable signal.

18. The method of testing as recited in claim 14 further comprising programming said delay value based on a slack margin associated with said node.

19. An integrated circuit, comprising:
an input cell and an observation cell of a scan chain;
a functional path having a node and coupled between said input cell and said observation cell; and
test circuitry distinct from said functional path and having a delay block, said test circuitry couplable, based on a test mode signal, between said node and said observation cell to form a testable path including said delay block and said node, wherein said delay block has a delay value for detecting a small delay defect associated with said node when a signal propagates through said testable path.

20. The integrated circuit as recited in claim 19 wherein said delay value is programmable.

21. A library of standard logic elements for including in an integrated circuit, comprising an integrated circuit including:
a functional logic path having a node, at least one sequential logic element and an observation cell; and
test circuitry distinct from and coupled to said functional logic path at said node and couplable to said observation cell based on a test mode signal, said test circuitry having a delay block and configured to form a testable path including said delay block and said node in response to said test mode signal, wherein said delay block has a delay value for detecting a small delay defect associated with said node when a signal propagates through said testable path.

* * * * *